(12) United States Patent
Kim

(10) Patent No.: US 6,767,771 B2
(45) Date of Patent: Jul. 27, 2004

(54) METHOD FOR FORMING A PATTERN AND A SEMICONDUCTOR DEVICE

(76) Inventor: Ki-Bum Kim, Tapmaeul Byuksan APT. 607-1702, Yatap-dong, Puntang-gu, Seongnam-shi, 463-070 Kyonggi-do (KR)

( * ) Notice: Subject to any disclaimer, the term of this patent is extended or adjusted under 35 U.S.C. 154(b) by 0 days.

(21) Appl. No.: 10/220,365

(22) PCT Filed: Jan. 10, 2002

(86) PCT No.: PCT/KR02/00043

§ 371 (c)(1),
(2), (4) Date: Aug. 29, 2002

(87) PCT Pub. No.: WO02/056354

PCT Pub. Date: Jul. 18, 2002

(65) Prior Publication Data

US 2003/0052342 A1 Mar. 20, 2003

(51) Int. Cl.[7] ............................................ H01L 21/335
(52) U.S. Cl. ...................................... 438/142; 438/197
(58) Field of Search ................................. 438/142, 197, 438/198, 700, 712, 308, 289; 250/427

(56) References Cited

U.S. PATENT DOCUMENTS

| | | | |
|---|---|---|---|
| 5,079,112 A | 1/1992 | Berger et al. | 430/4 |
| 5,130,213 A | 7/1992 | Berger et al. | 430/4 |
| 5,258,246 A | 11/1993 | Berger et al. | 430/4 |
| 5,532,184 A | 7/1996 | Kato | 437/133 |
| 5,767,521 A * | 6/1998 | Takeno et al. | 250/492.2 |
| 6,159,620 A * | 12/2000 | Heath et al. | 428/615 |
| 6,211,013 B1 | 4/2001 | Park et al. | 438/257 |
| 6,335,245 B2 | 1/2002 | Park et al. | 438/257 |
| 6,342,716 B1 * | 1/2002 | Morita et al. | 257/315 |
| 2003/0155523 A1 * | 8/2003 | Kim | 250/427 |

FOREIGN PATENT DOCUMENTS

| | | |
|---|---|---|
| JP | 11111618 A | 4/1999 |
| JP | 11266004 A | 9/1999 |
| JP | 11-329959 | 11/1999 |
| JP | 2000-307097 | 11/2000 |

* cited by examiner

Primary Examiner—Tuan H. Nguyen
(74) Attorney, Agent, or Firm—Grossman, Tucker, Perreault & Pfleger, PLLC

(57) ABSTRACT

The present invention relates generally to a method for forming a pattern, and in particular, to a method for forming a pattern for the formation of quantum dots or wires with 1~50 nm dimension using the atomic array of a single or poly crystalline material. The electron beam lithography method preferably uses the phase contrast atomic image of a single or poly crystalline material itself.

15 Claims, 24 Drawing Sheets

| CRYSTAL SYSTEMS | P | C | I | F |
|---|---|---|---|---|
| TRICLINIC |  | | | |
| MONOCLINIC |  |  | | |
| ORTHORHOMBIC |  |  |  |  |
| TETRAGONAL |  | |  | |
| RHOMBOHEDRAL |  | | | |
| HEXAGONAL |  | | | |
| CUBIC |  | |  |  |

METHOD FOR FORMING A PATTERN AND A SEMICONDUCTOR DEVICE

BACKGROUND OF THE INVENTION

1. Field of the Invention

The present invention relates generally to a method for forming a pattern and a semiconductor device, and in particular, to a method for forming a pattern for the formation of quantum dots or wires with 1~50 nm dimension using the atomic array of a crystalline material and to the manufacture of functional devices that have such a structure.

The present invention relates generally to a method for forming a pattern and a semiconductor device, and in particular, to a method for forming a pattern for the formation of quantum dots or wires having a nano or tens of nano meter order using the atomic array of a single or a poly crystalline material and to the manufacture of functional devices that have such a structure. The electron beam lithography method in accordance with the present invention uses the phase contrast atomic image of a single or a poly crystalline material itself.

2. Description of the Related Art

The formation process of quantum dots or wires becomes the core process for the fabrication of an electronic, magnetic, or optical device with quantum dots or wires as the application of such devices is increasingly expected. A fundamental operating principle of such devices is based on quantum mechanical results that the physical properties of the particle are greatly affected by its size as it becomes nanometer-sized. Particularly, there are many researches for the single electron transistor which has been suggested as the alternative to MOS device in order to overcome the limitation of the MOS device that has been developed continuously for 40 years.

Previous researches on the formation processes of quantum dots or wires can largely be divided as follows.

First, there is a method in which one or a few quantum dots or wires are formed by AFM (Atomic Force Microscopy), STM (Scanning Tunneling Microscopy) and electron beam lithography. This method has the capability to form the quantum dots or wires whose size and location are controlled experimentally, but has difficulty in applying to mass production because of a low throughput.

Second, there is a method in which quantum dots or wires are formed by the process of patterning and etching. In this method, patterning means the formation process of quantum dots or wires on the substrate by the electron beam direct-writing, or by the etching of the chemical substance which was imprinted by the mask or mold made with an electron beam.

Third, there is a method in which quantum dots or wires are formed by the nucleation at the early state of phase transition of materials. This method has can be applied to mass production, but has problems in controlling the size, density or distribution of quantum dots or wires.

SUMMARY OF THE INVENTION

Therefore, it is an object of the present invention to provide a method for forming a pattern using a crystal structure of a single or a poly crystalline material as a mask.

It is another object of the present invention to provide a method for forming quantum dots and wires of uniform size and density which can be controlled by patterning a layer using a crystal structure of a single or a poly crystalline material as a mask.

It is a further object of the present invention to provide a method for forming quantum dots and wires using a crystal structure of a single or a poly crystalline material for fabricating semiconductor devices in practice.

It is still another object of the present invention to provide a semiconductor device having the structure of quantum dots or wires. The foregoing and other objects of the present invention can be achieved by providing a method for forming a pattern wing a crystal structure of a single or poly crystalline material as a mask. According to one aspect of the present invention, a method for forming a pattern using a crystal structure of a single or poly crystalline material is comprising the steps of locating the material having a crystal structure in the chamber of the transmission electron microscope; radiating an electron beam to the material; forming a pattern from a lattice image of the material having a crystal structure on the surface of an irradiated material such as a electron beam resist deposited substrate by diffracted electron beam and transmitted electron beam passed through the material.

Preferably, the lattice image is formed by a method of the phase contrast imaging.

Preferably, the material having a crystal structure is processed into a thickness of a few tens of nanometer.

Preferably, the irradiated material is an electron beam resist deposited material on a semiconductor substrate.

Preferably, the semiconductor substrate has been applied with an electron beam resist deposited on after deposition of a gate oxide and an amorphous silicon on the substrate in which source and drain regions are already formed.

BRIEF DESCRIPTION OF THE DRAWINGS

The above and other objects, features and advantages of the present invention will become more apparent from the following detailed description when taken in conjunction with the accompanying drawings in which:

FIG. 5C is rotated 56° clockwise and 15° azimuthally.

FIG. 6C is rotated 56° clockwise and 15° azimuthally.

DETAILED DESCRIPTION OF THE PREFERRED EMBODIMENTS

Hereinafter, preferred embodiments of the present invention will be described in detail with reference to the accompanying drawings. In the following description, well-known functions or constructions are not described in detail.

At first, to help understanding of the invention, crystal structures of general materials and their various schematic figures will be illustrated.

It is well known that the materials in the earth are composed of atoms and molecules which contain a few atoms and particularly, solid material is classified into a crystalline material in which the atoms are situated in a repeating or periodic array over large atomic distances and an amorphous material that lacks a systematic and regular arrangement of atoms over relatively large atomic distances. The research on the periodic array of the atoms started in 1912 by Max von Laue who found x-ray diffraction. In 1913 W. H. Bragg and his son solved the crystal structure of diamond and salt by x-rays and in 1920 Ewald introduced the concept of the reciprocal lattice. Until now, the crystal structures of more than a hundred thousand of organic or inorganic compounds in the earth have discovered.

Figure 1A:
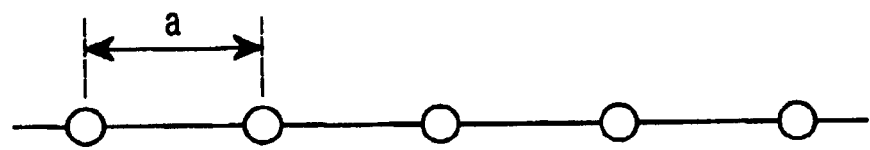
FIGS. 1A to 1C illustrate lattice points moved one-dimensional, two-dimensional, three-dimensional respectively.

If a point is moved by the distance a parallel to a certain direction, it matches second point and if that is moved the same way, that becomes third point. As the same way one point is moved parallel repeatedly, an array of points is made as shown FIG. 1A. This array of points which is generated with being repeatedly shifted at regular distance along the given direction is called lattice. The motion of shifting a point in this manner is called translation and expressed as vector a. Here regular distance, that is, the magnitude of the vector |a|=a is called period or unit period. In this array of points, each point is the same and if one point is marked as an origin.

Figure 1B:
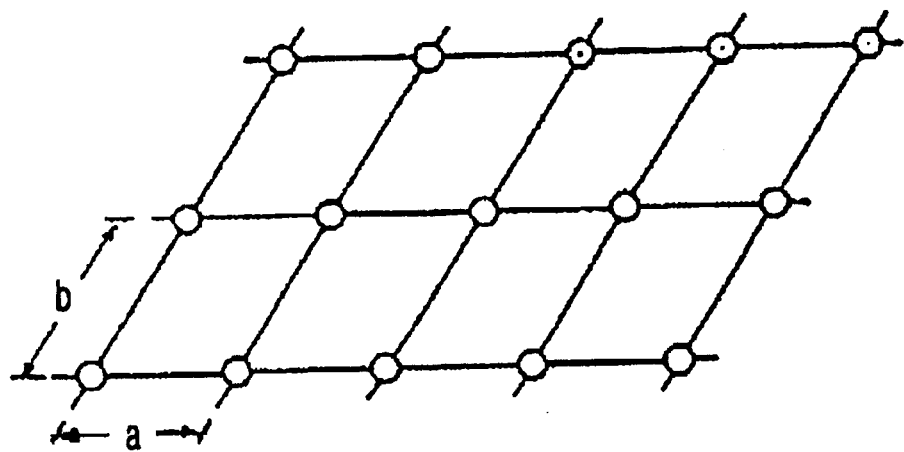
Figure 1C:
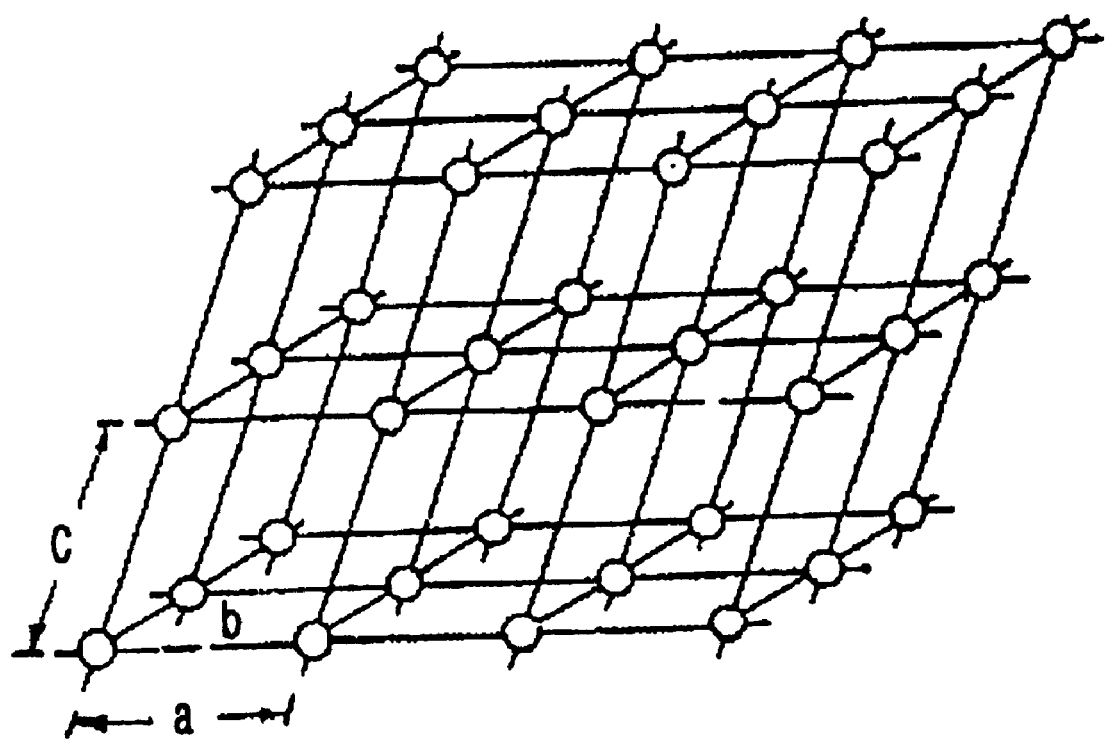

That is, r=ma where m is an integer from −∞ to ∞,

Point network plane is generated by translation this array of points to the other direction as shown FIG. 1B and this is called lattice plane. When this lattice plane is translated to translation c, the third direction which is not parallel to this plane, three dimensional point network plane is generated and called space lattice. In this space lattice, each lattice point is described by position vector r from the origin and expressed as, r=ma+nb+pc where, m, n, p are integers between −∞ to ∞. The space lattice is infinitely spread in infinite space as shown FIG. 1C.

Figure 2:
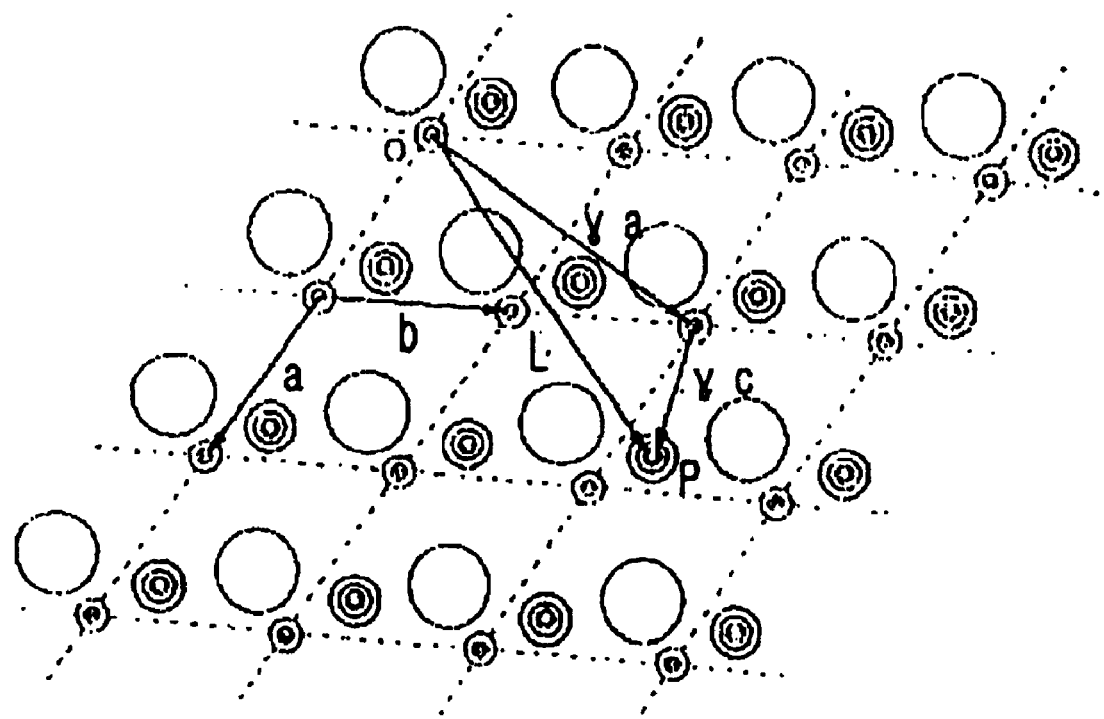
FIG. 2 illustrates an arrangement of atoms around the lattice point.

It is said that a crystal is macroscopically uniform, because the properties of a part of crystal are the same as those of the other part at arbitrary distance away. FIG. 2 shows an imaginary crystal structure. A certain point p in this crystal is described by the position vector, L, and the unit translation vectors of this lattice a, b, c, $$L = Xa + Yb + Zc$$
$$= (m+x)a + (n+y)b + (p+z)c$$
$$= (ma + nb + pc) + (xa + yb + zc)$$
$$= r + rl$$

where, X, Y, Z are real numbers and x, y, z are decimals between 0 and 1. That is, a certain point in space is expressed by rl which represents a crystal lattice, and r which represents position vector in the lattice. Here, the unit lattice described by three translation vectors is called a unit cell.

When a certain point in the crystal is fixed as the origin (0,0,0), all lattice points generated from this point (0,0,0) are identical with the origin and have the same properties. That is to say, whatever point is fixed as the origin in the crystal, every lattice point made by translation from this point is identical. Identical means all properties (including the geometric form of the surroundings around this point, chemical properties such as a kind of neighbor atoms, or physical properties such as electron density, potential difference) are exactly the same.

All crystalline includes one of the 7 crystal systems by the relation between three vectors, a, b, c that determine unit cell. TABLE 1 shows the relation between lattice parameters which defines three axes of unit cell.

TABLE 1

| Crystal structure | Crystal system | Lattice parameter |
| --- | --- | --- |
| Cubic | Cubic | A = b = c |
|  |  | α = β = γ = 90° |
| Hexagonal | Hexagonal | A = b ≠ c |
|  |  | α = β = 90° γ = 120° |
| Trigonal | Rhombohedral | A = b = c |
|  |  | α = β = γ ≠ 90° |
| Tetragonal | Tetragonal | A = b ≠ c |
|  |  | α = β = γ = 90° |
| Orthorhombic | Orthorhombic | A = b = c |
|  |  | α = β = γ = 90° ≠ |
| Monoclinic | Monoclinic | 1. c-unique |
|  |  | a ≠ b ≠ c |
|  |  | α = β = 90° ≠ γ |
| Monoclinic | Monoclinic | 2. b-unique |
|  |  | a ≠ b ≠ c |
|  |  | α = γ = 90° ≠ β |
| Triclinic | Triclinic | A ≠ b ≠ c |
|  |  | α ≠ β ≠ γ ≠ 90° |

Figure 3:
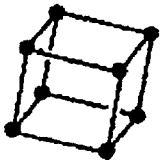
FIG. 3 illustrates the 7 crystal systems and the 14 Bravais lattices.
Figure 3:
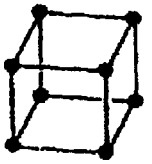
Figure 3:
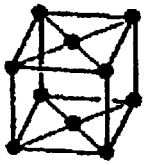
Figure 3:
Figure 3:
Figure 3:
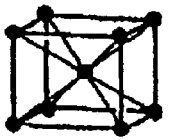
Figure 3:
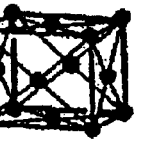
Figure 3:
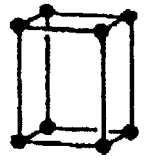
Figure 3:
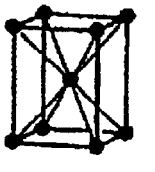
Figure 3:
Figure 3:
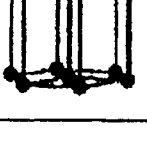
Figure 3:
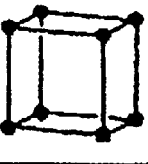
Figure 3:
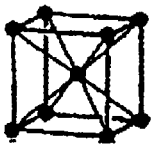
Figure 3:
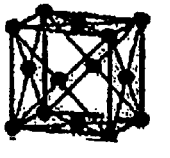

Also all crystalline have one of the 14 Bravais lattices as shown in FIG. 3. It is classified according to the number of lattice points in unit cell as the primitive cell (P) has one lattice point in unit cell, the base-centered cell (A, B or C) has one lattice point in the center of one plane, the face-centered cell (F) has lattice points in the center of each plane and the body-centered cell (I) has one lattice point in the center of the unit cell.

The crystal structure, of which more than a hundred thousand of organic or inorganic materials have been known until now, is classified as the 7 crystal systems and the 14 Bravais lattices. Actual crystal structure is composed by the arrangement of one or more of the same or different atoms in each lattice point which is included in the 14 Bravais lattice.

Next, some examples of such a crystal structure are given and the pattern from the arrangement of atoms which is shown when those crystal structures are projected to the given crystallographic orientation is explained.

Figure 4A:
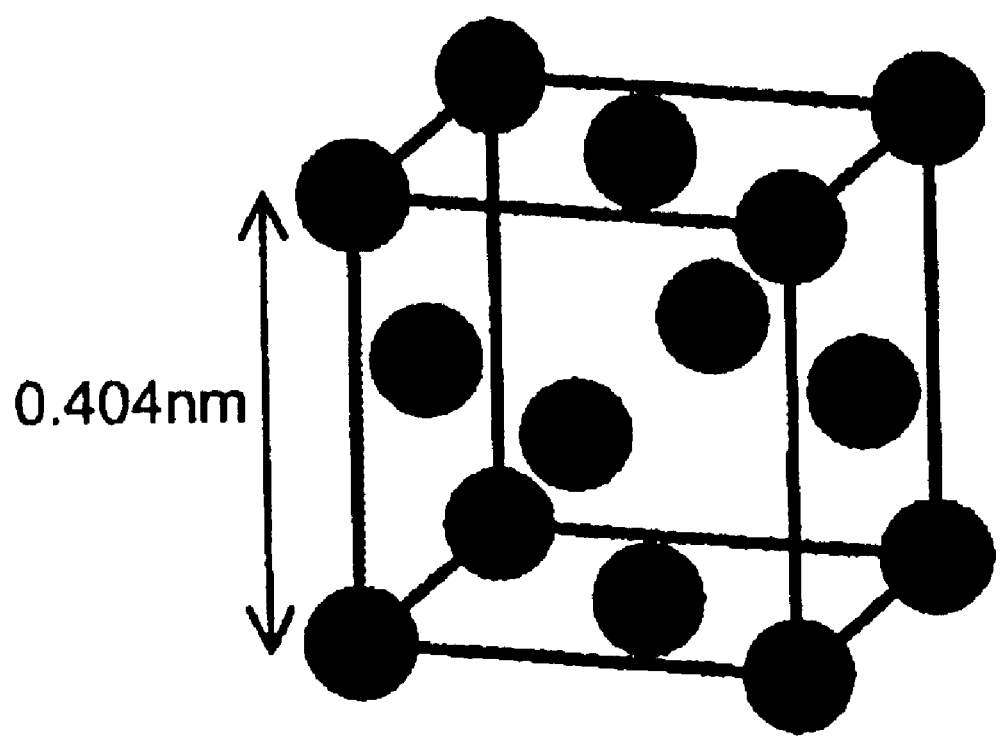
FIG. 4A illustrates a unit cell of crystal structure of Al.
Figure 4B:
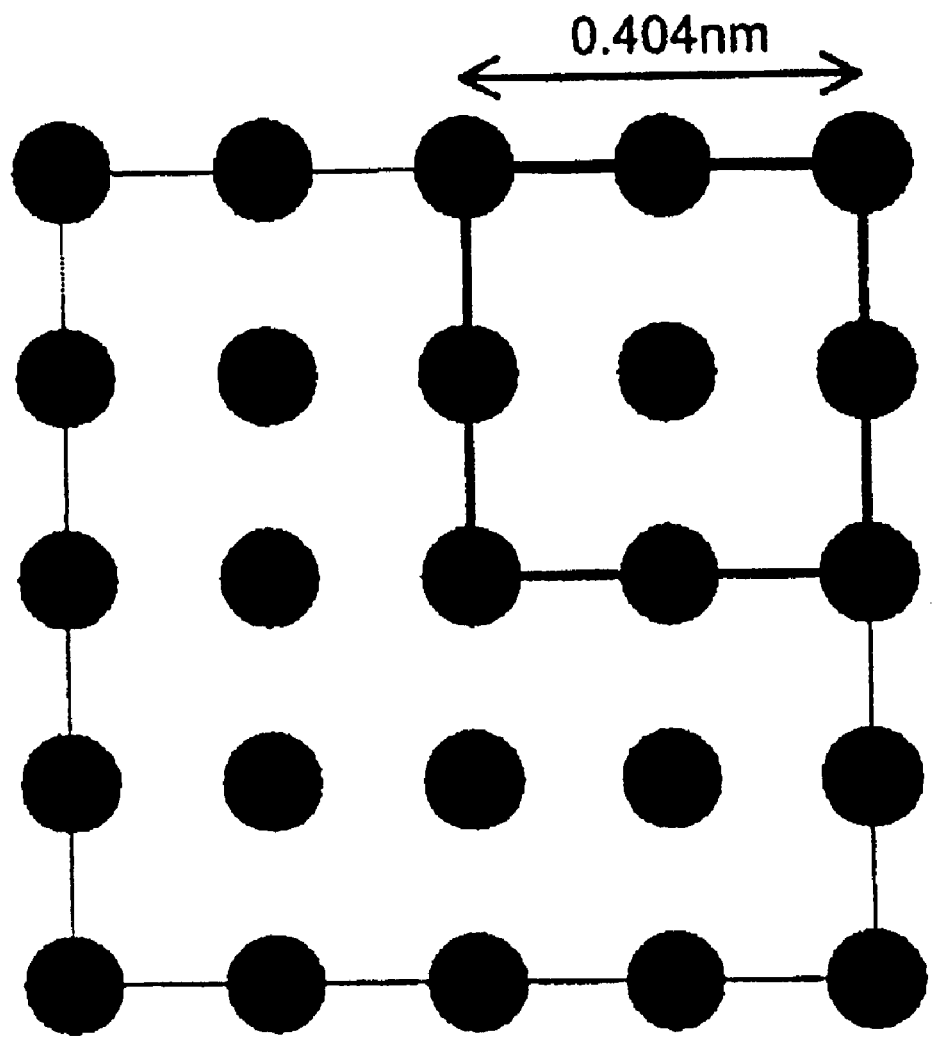
FIGS. 4B to 4D illustrate two-dimensional projection patterns of Al crystal through the [100], [110], [111] crystallographic orientations.
Figure 4C:
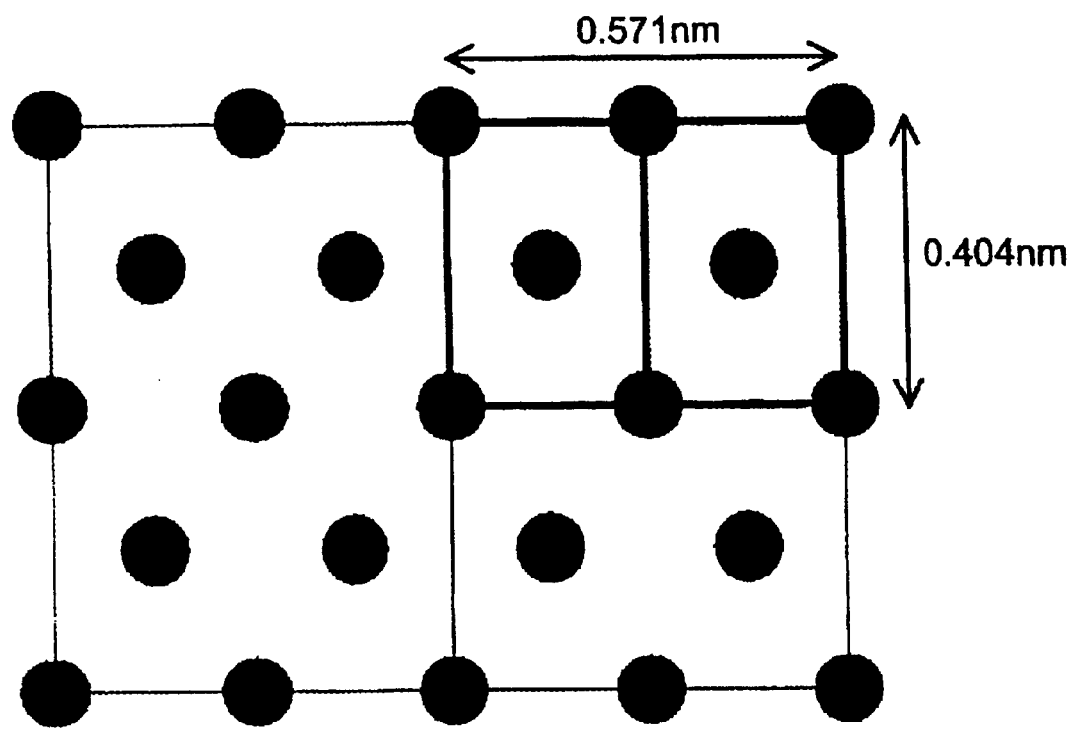
Figure 4D:
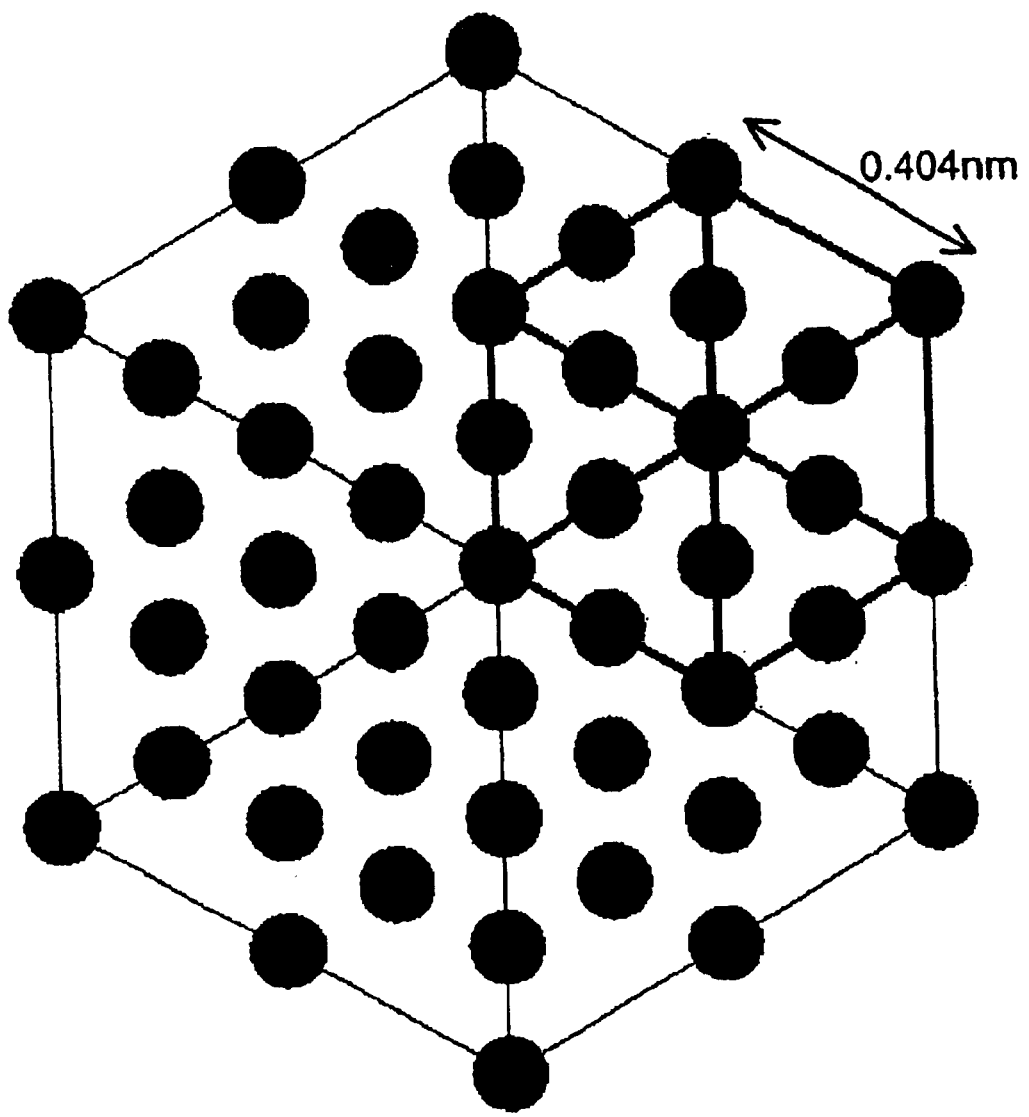

For example, Al is a cubic crystal system (a=b=c) and the face-centered cell of the Bravais lattices, so it has four lattice points in one unit cell. The crystal structure of Al is made when one Al atom lies in one lattice point, and the lattice constant of Al is a=b=c=0.404 nm. Therefore the structure of Al unit cell is shown as FIG. 4A. FIGS. 4B, 4C, and 4D show the projection pattern of atomic arrangement through [100], [110] and [111] crystallographic orientations.

Figure 5A:
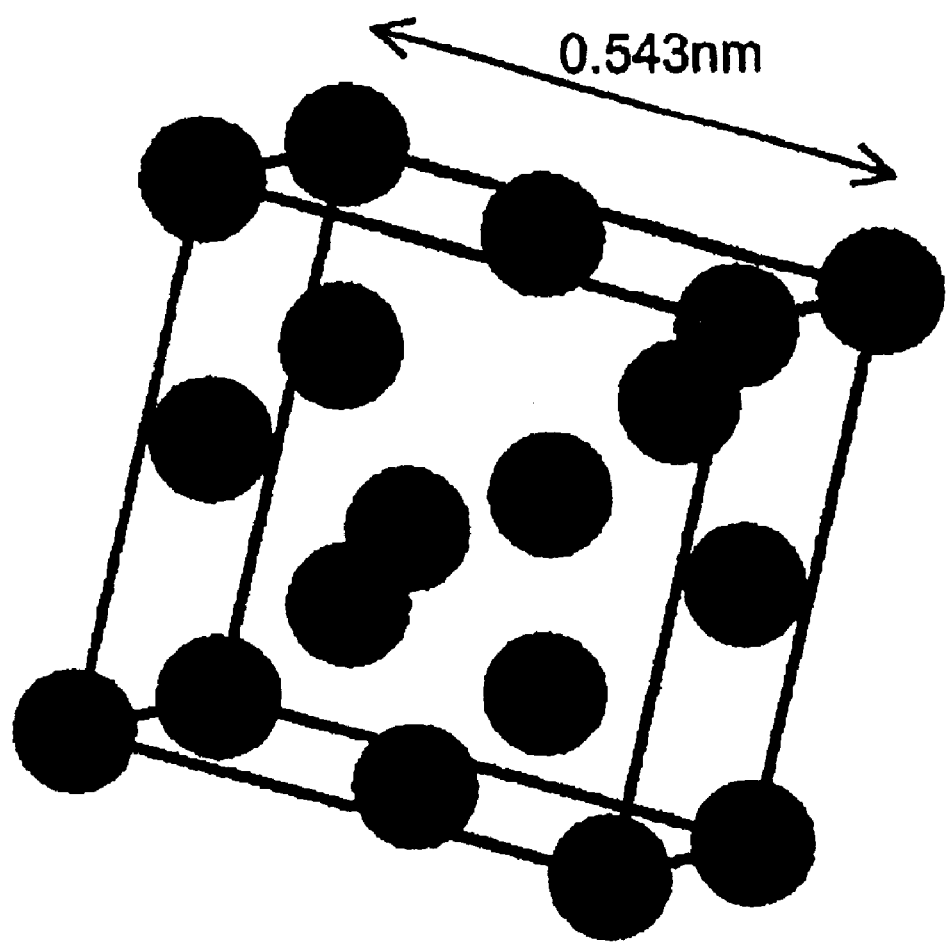
FIG. 5A illustrates a unit cell of crystal structure of Si.
Figure 5B:
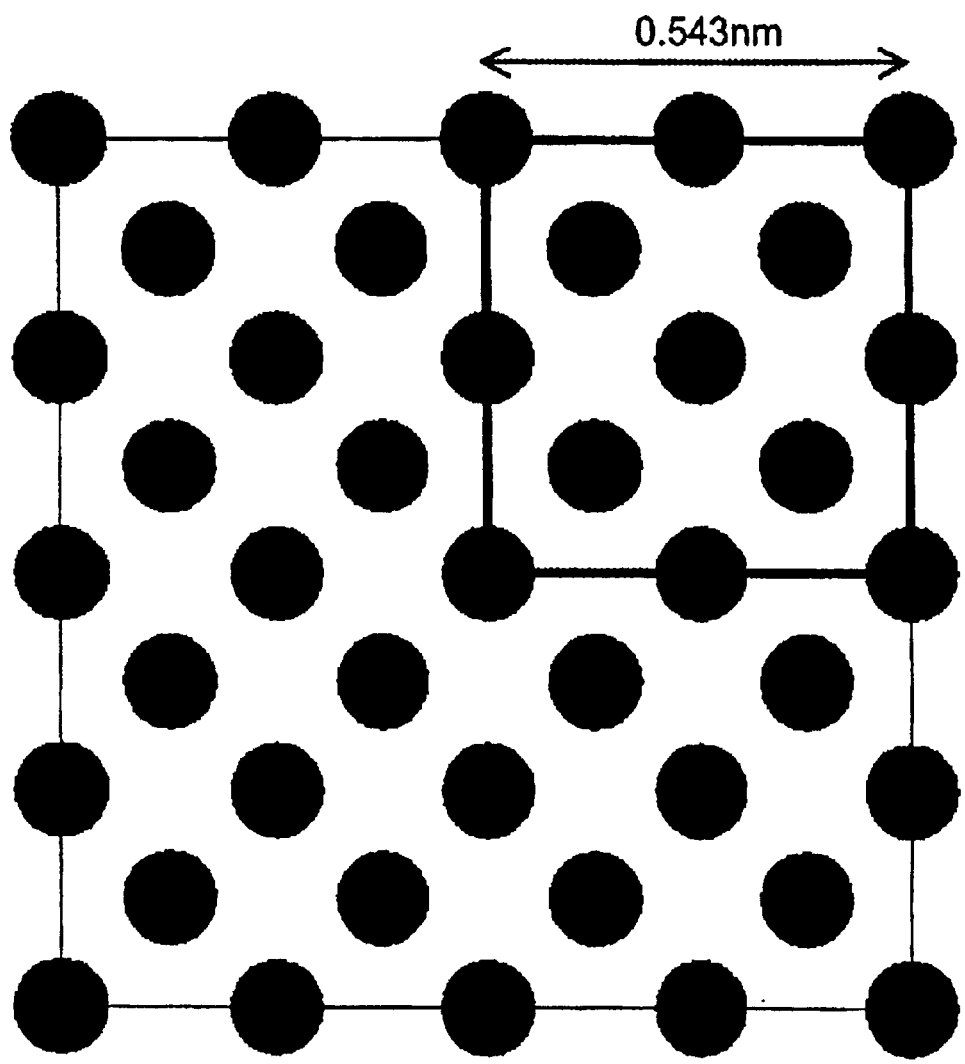
FIGS. 5B to 5D illustrate two-dimensional projection patterns of Si crystal through the [100], [110], [111] crystallographic orientations.
Figure 5C:
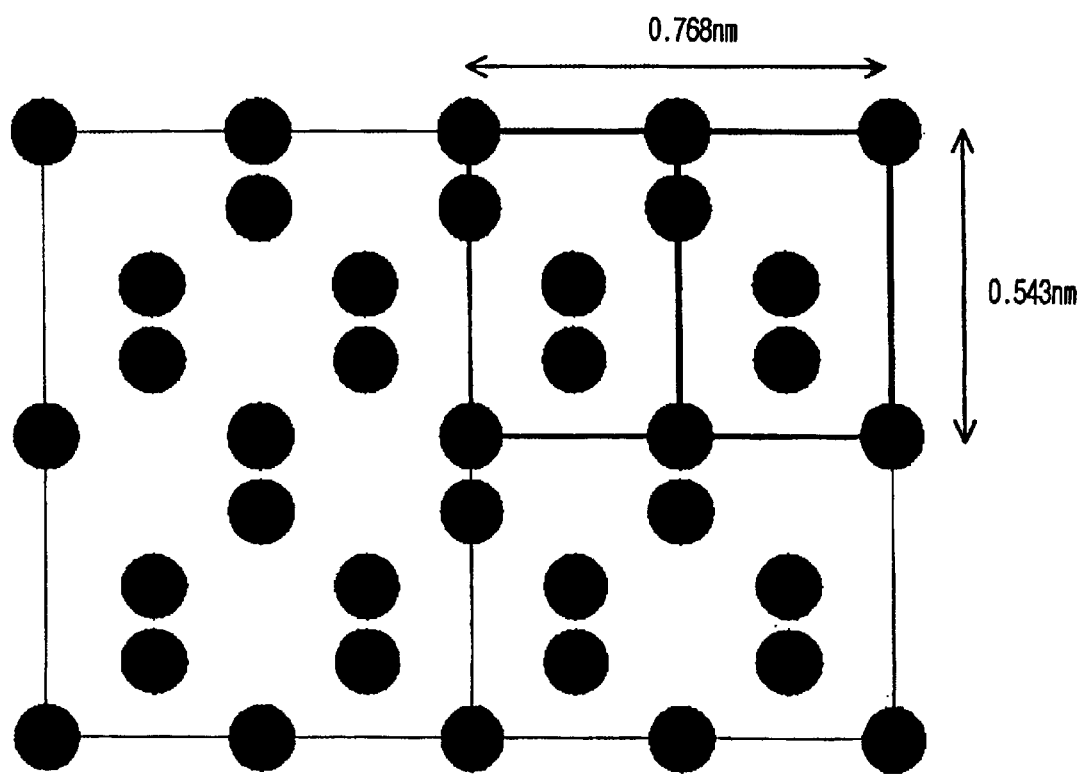
Figure 5D:
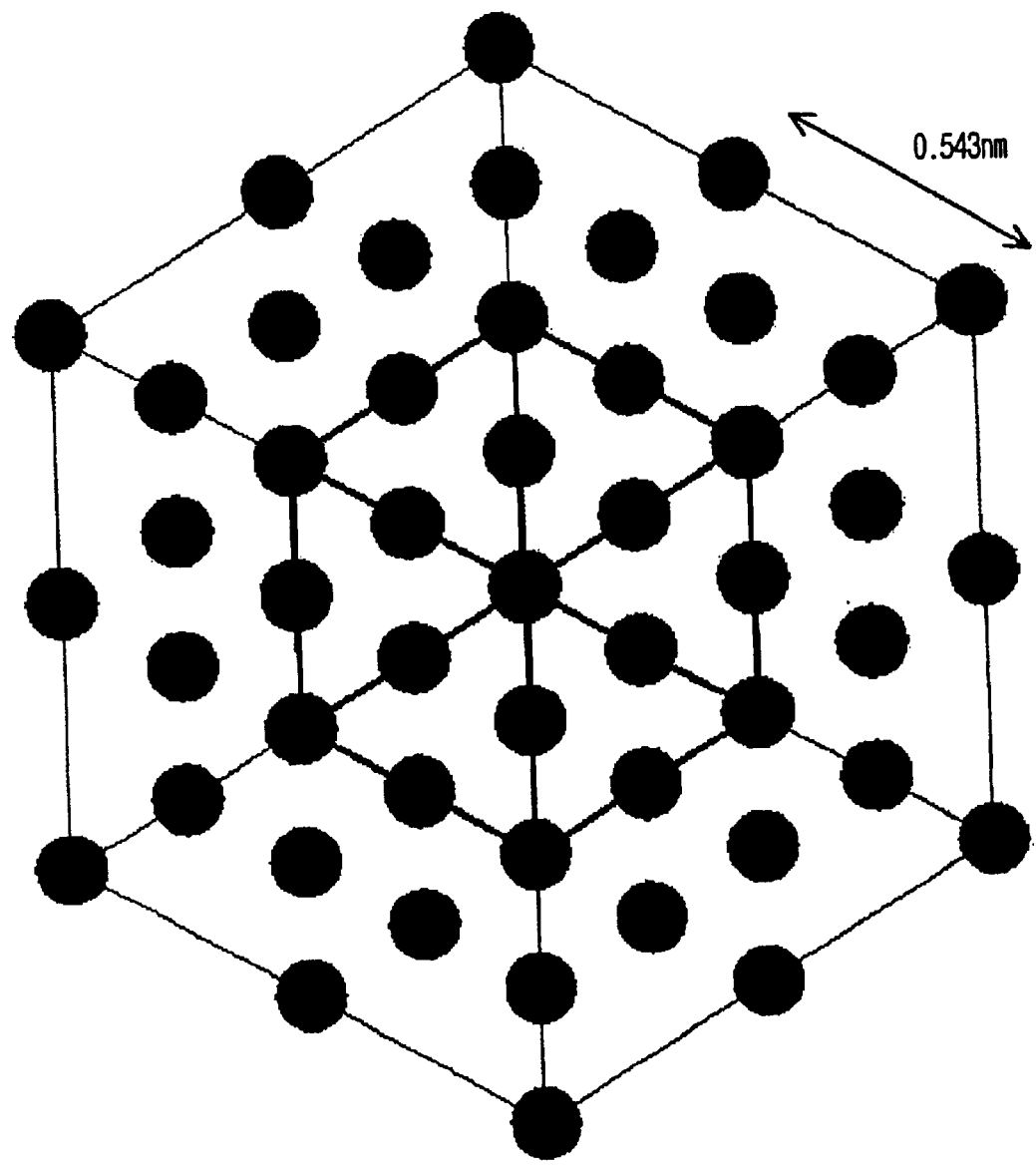
Figure 5E:
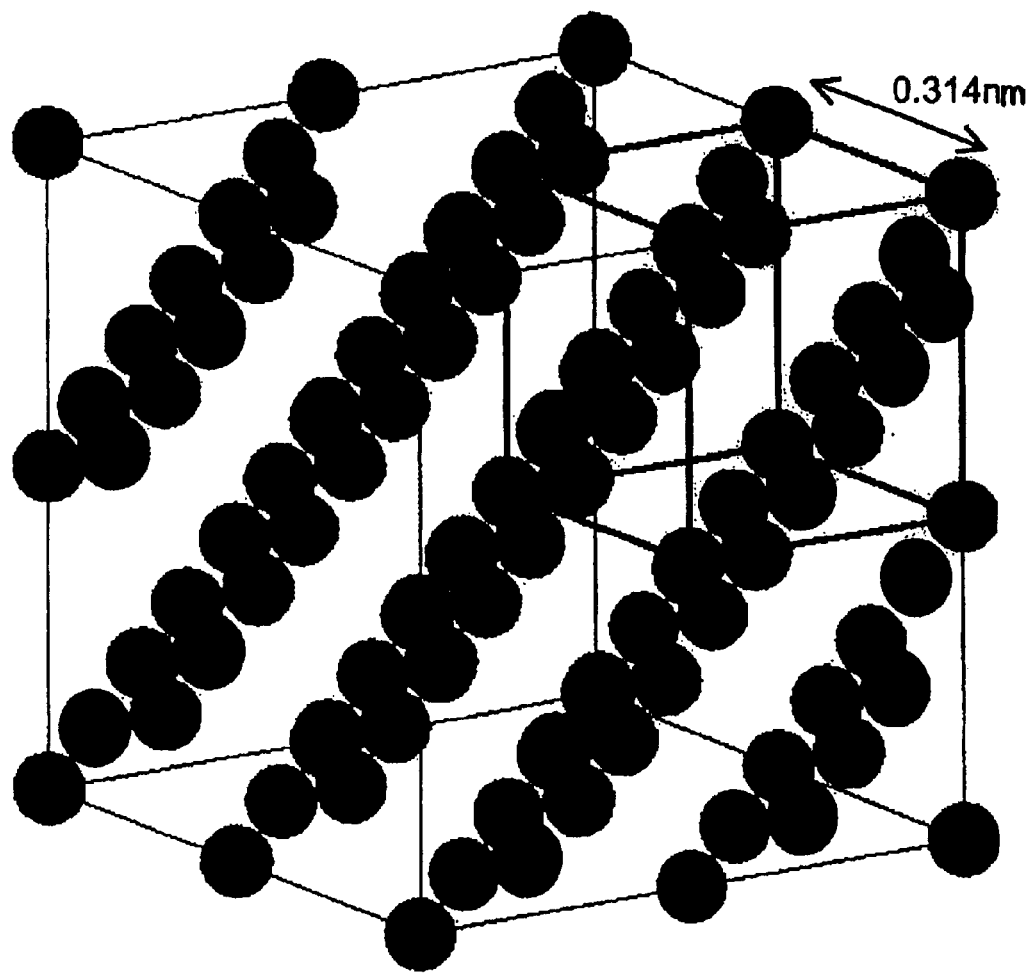
FIG. 5E illustrates a three-dimensional projection pattern when

The other example is Si of a diamond crystal structure. Si is cubic crystal system and the face-centered of the Bravais lattices like Al (Face Centered Cubic). So it has four lattice points in one unit cell, but it has two atoms in one lattice point unlike simple face-centered cubic crystal system (lattice parameter a=b=c=0.543 nm). Therefore there are eight atoms in a Si unit cell. FIG. 5A shows the unit cell of Si. As the same way FIGS. 5B, 5C and 5D show the two-dimensional projection pattern of atomic arrangement through [100], [110] and [111] crystallographic orientations. FIG. 5E shows the pattern when FIG. 5B is rotated 56° clockwise and 15° azimuthally. As shown FIG. 5C, the image looks like several lines. This is the evidence that depending on processing techniques, Si single crystal can apply to the form of quantum wires in a single electron transistor device.

Figure 6A:
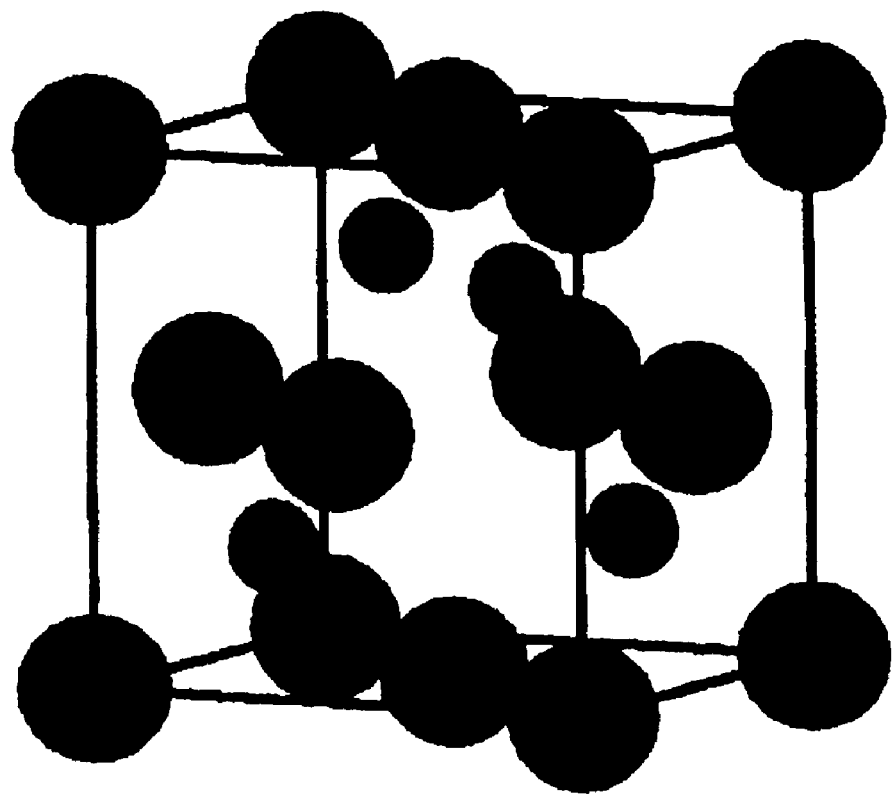
FIG. 6A illustrates a unit cell of crystal structure of GaAs.
Figure 6B:
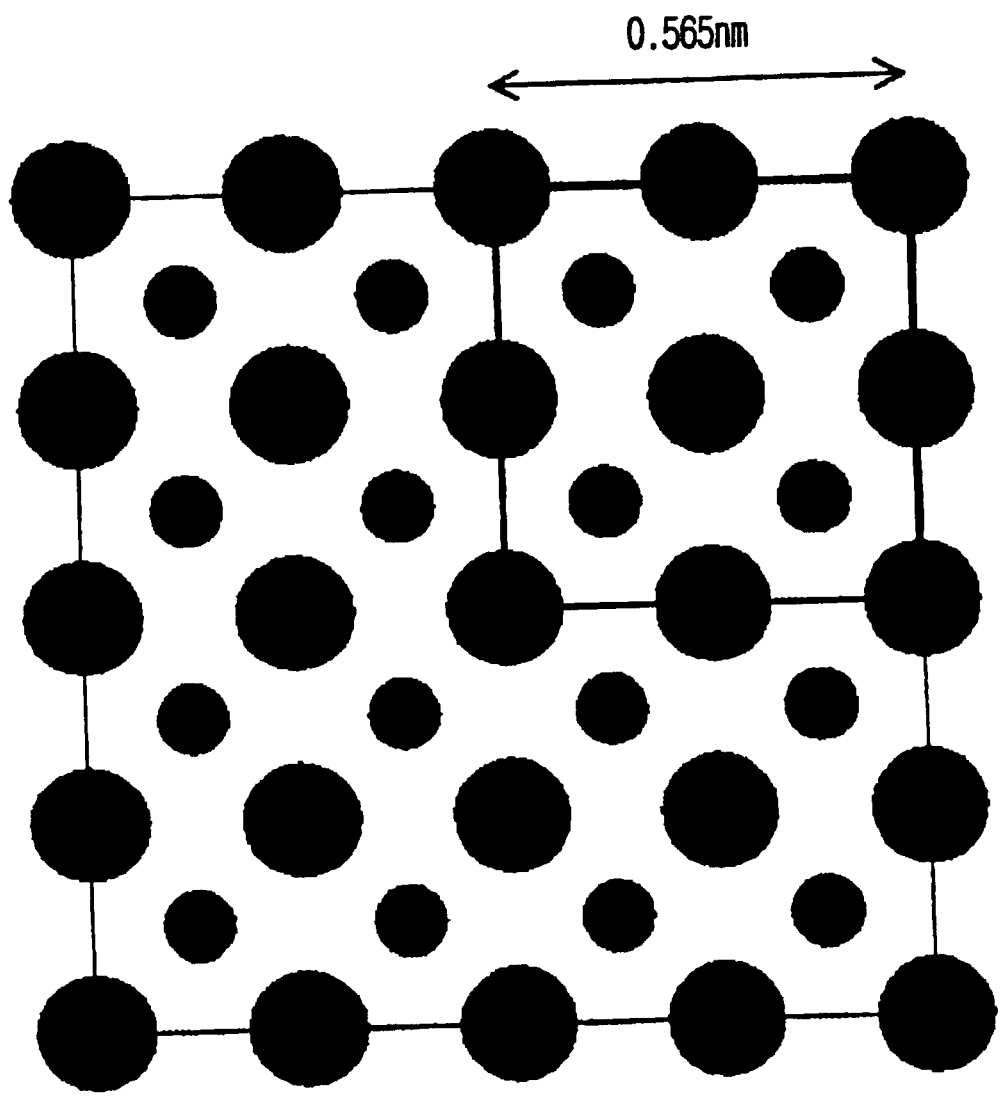
FIGS. 6B to 6D illustrate two-dimensional projection patterns of GaAs crystal through the [100], [110], [111] crystallographic orientations.
Figure 6C:
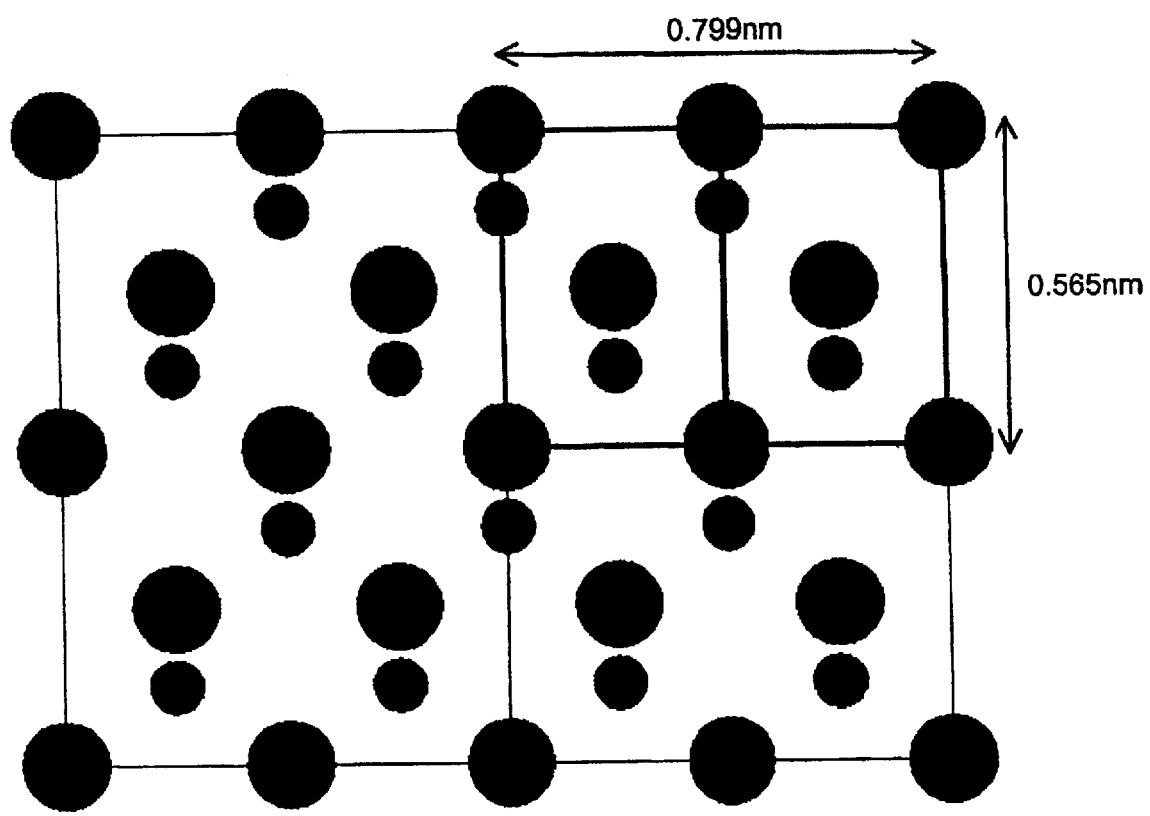
Figure 6D:
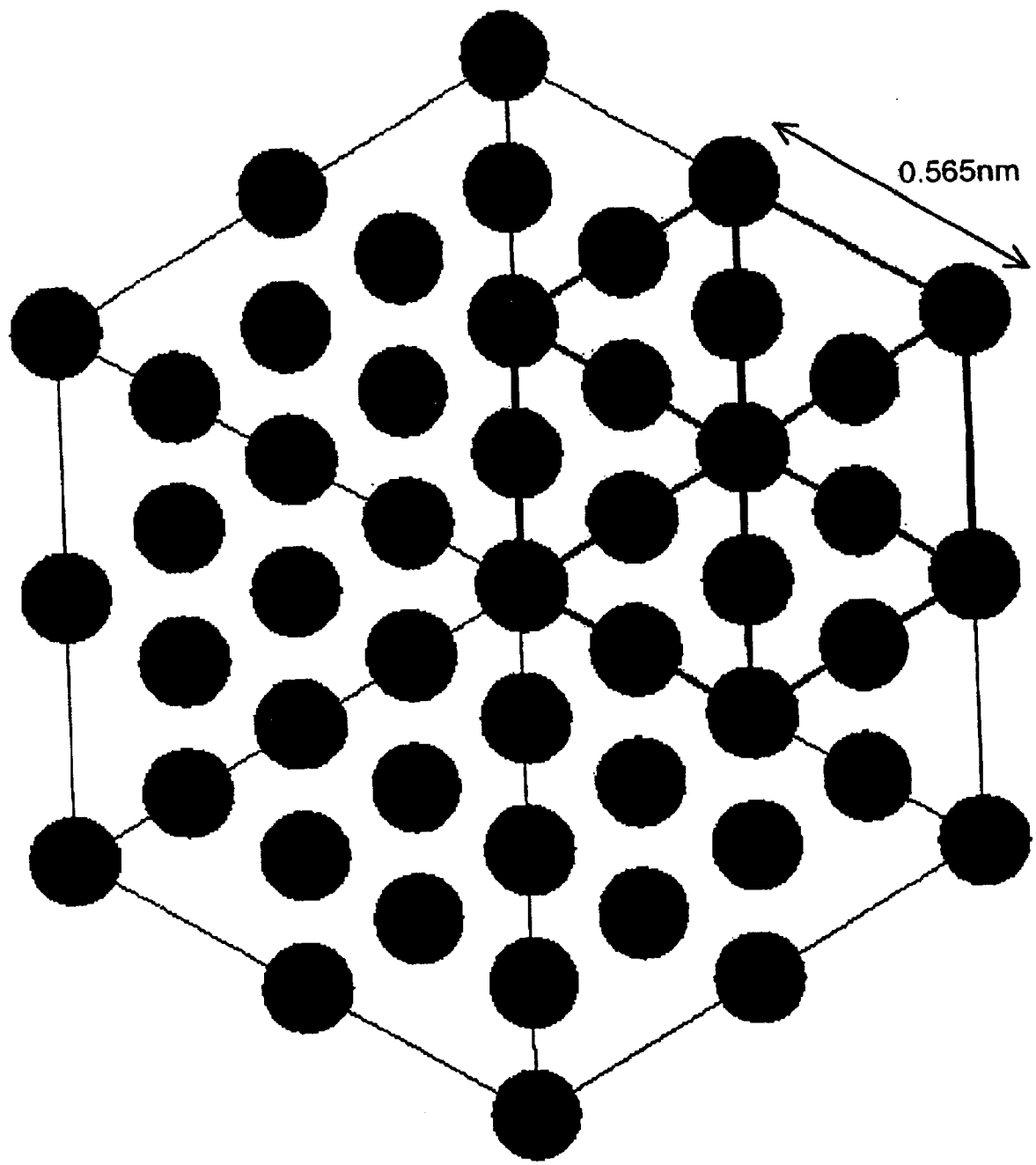
Figure 6E:
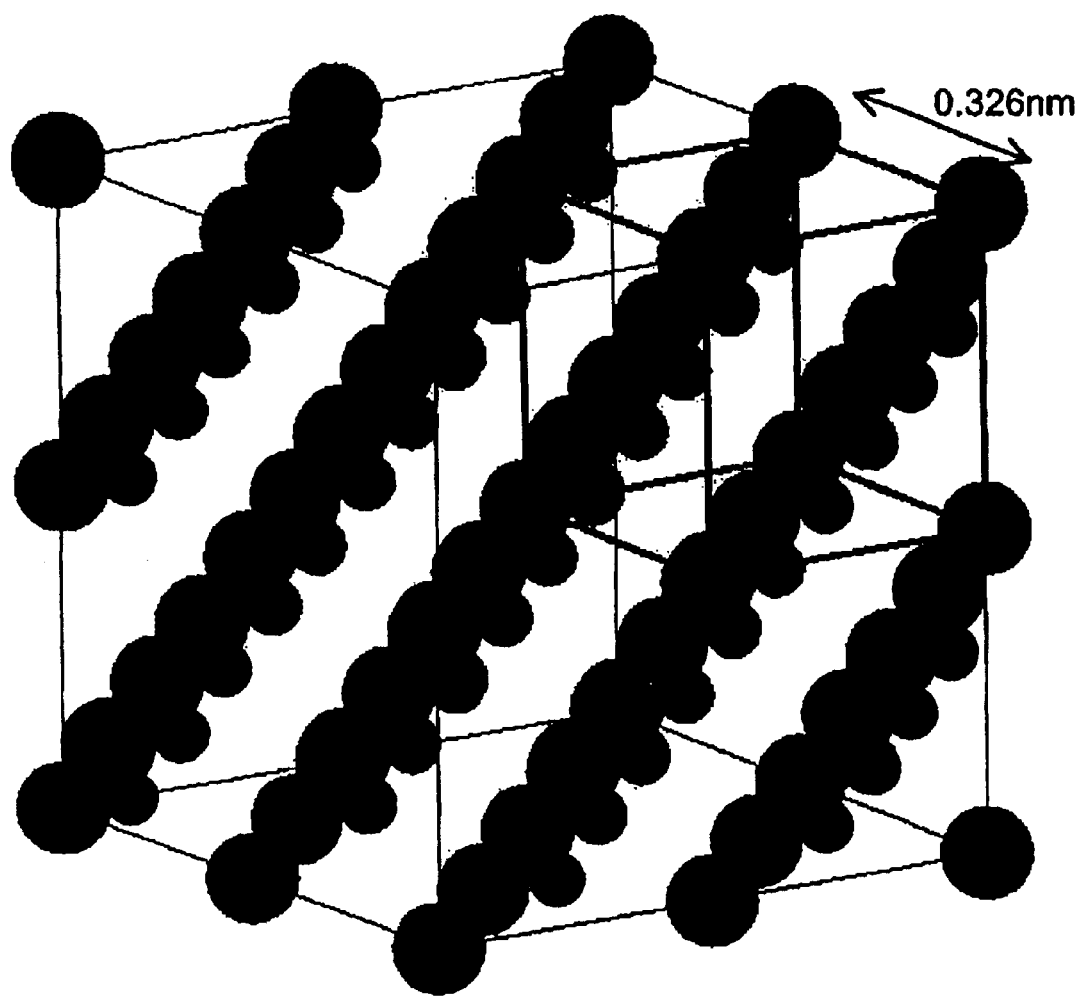
FIG. 6E illustrates a three-dimensional projection pattern when

And another example is the crystal structure of GaAs. GaAs has a crystal structure of cubic like Al and Si, and the face-centered Bravais lattice like Si. But, unlike Al of a simple cubic lattice and Si of a diamond crystal structure, GaAs has a crystal structure which is an one Ga atom and one As atom at one lattice point.(lattice parameter a=b=c=0.565 nm) FIG. 6A shows the unit cell of crystal structure of GaAs. By the same way, FIGS. 6B, 6C, 6D are two-dimensional projection patterns of GaAs crystal through the [100], [110], [111] crystallographic orientations. FIG. 6E shows the pattern when FIG. 6C is rotated 56° clockwise and 15° azimuthally in the same manner of FIG. 5E. Like Si, the single crystal of GaAs is a good example applicable to the quantum wire formation.

Al, Si, and GaAs mentioned above are only a few examples among the already known crystal structures over a hundred thousand. Thus, these demonstrations indicate that very various patterns generated by electrons transmitted in the two dimensional plane can be obtained. Of course, this generated pattern is dependent on the crystallographic orientation as well as on the crystal structure.

The atom's array of the crystal can be observed using the phase-contrast method in high resolution TEM (transmission electron microscopy). As the electron microscopy has developed, it is possible to distinguish the atoms alignments with the range of 0.14 nm–0.20 nm under 200 kV–300 kV of an accelerating voltage.

In the phase contrast method, atomic images can be made by the phase difference between diffracted electron beam and transmitted electron beam which is generated from the crystal material. This method has a much better resolution than other methods such as a diffraction contrast or an absorption contrast.

Figure 7:
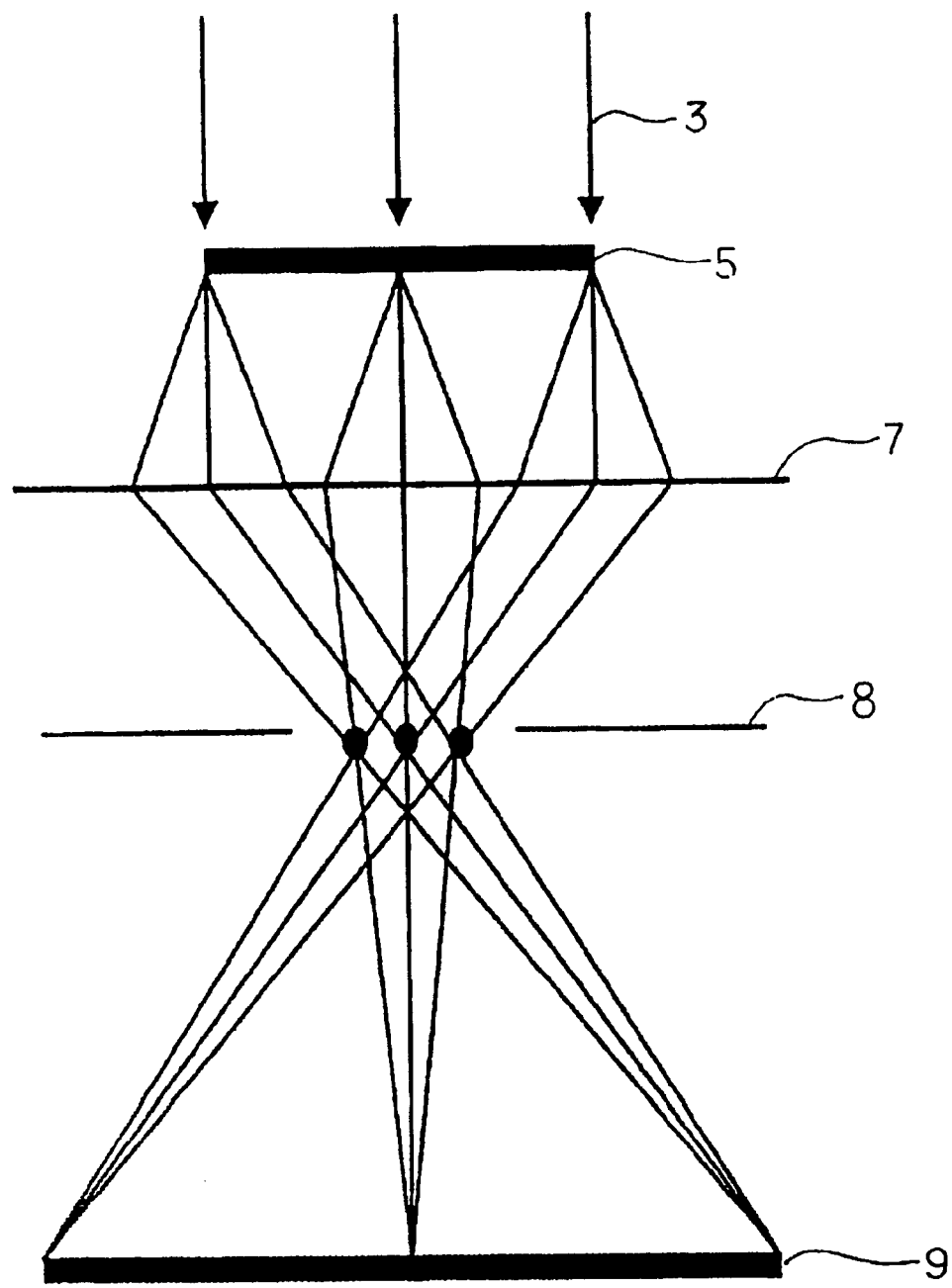
FIG. 7 is a schematic view of a first embodiment of Transmission Electron Microscopy(TEM) according to the present invention.

FIG. 7 shows how an interference image is made by the phase difference. As shown in FIG. 7, the image is formed by the phase difference between diffracted electron beams and transmitted beams in the plane of projection.

The material (5) with the thickness of a few tens of nanometer is putted in a chamber. Electron beam(3) can transmit this kind of thick material(5). At the same time, the interaction between the material(5) and the transmitted electrons cause the electron beam separated to diffracted beams and transmitted beams.

Transmitted beam and diffracted beam, which were separated during the transmission through the material (5), pass an objective lens (7) and an aperture (8). As a result of the interference with these two beams, the lattice image of crystal structure is formed. In the present invention, the image plane means the plane where transmitted beam and diffracted beam make the lattice image of a crystal structure by their interference during the transmission of material (5). This image formed in the image plane (9) can be magnified, used as it is or contracted by the lens. In the present invention, the pattern is formed using this image.

The distance of the interference fringe is proportional to the spacing of lattice, which is the distance between atoms. As a result, the atomic array can be distinguished by this interference pattern.

In fact, in the practical high resolution TEM, the first interference image which is formed by the objective lens is magnified sequentially by other lens which is located behind the objective lens. As a result, this image which is magnified by several hundreds of thousand can be observed directly. In general, magnification of an objective lens is the range from several decades to several hundreds. For example, when the magnification of an objective lens is one hundred, 3 nm spacing of atomic array is magnified into 30 nm that is a spacing of interference image. When this interference image is magnified or down scaled again by other lens, the image of atomic line and atoms with the range from a few nm to a few tens of nm will be obtained.

The present invention is intended to make to pattern by using the crystal structure of a single or a poly crystalline sample material. The electron beam is radiated to the sample material which has a crystal structure and is loaded in the chamber. When the electron is transmitted through this sample, the lattice image is formed by the phase contrast method. The phase contrast is generated by the interference between the transmitted electron beam and the diffracted electron beam. By using this lattice image of the crystal structure, the pattern for the fabrication of the functional device can be obtained.

In this embodiment, method for forming a pattern using a crystal structure of a single or a poly crystalline material is to fabricate the semiconductor devices, by placing of a single or a poly crystalline material having a crystal structure in the chamber of the TEM, irradiating electron beam, ten, forming a lattice image of that material by a method of the phase contrast imaging, and finally fanning the pattern in the semiconductor substrate from a lattice image of the material having a crystal structure.

In the present invention, the method to fabricate the pattern is as follows. The lattice image which is formed in the image plane is magnified or down-scaled to the intended size. Then, this image can expose the electron beam resist which is applied on the semiconductor materials. This image can be formed by using some parts of the lattice image of the sample material loaded in the chamber.

In the high resolution TEM that is used currently, the resolution of the atomic scale is already guaranteed. Therefore, in a method for forming a pattern introduced in the invention, if lattice images of a crystal structure that is formed at the imaging plane is scaled down instead of scaling up, then semiconductor substrate that is applied with the photo resist is exposed to this image. As a result, it is possible to form patterns of a few angstrom on the semiconductor wafer.

The shape of the pattern, which is formed by using a crystal structure of a material by a method of the invention, is determined by a crystal structure of the material used. Therefore, the location of atoms and distances of the atoms in a crystal structure of a material is embodied in the final semiconductor device as it is shaped.

Figure 8:
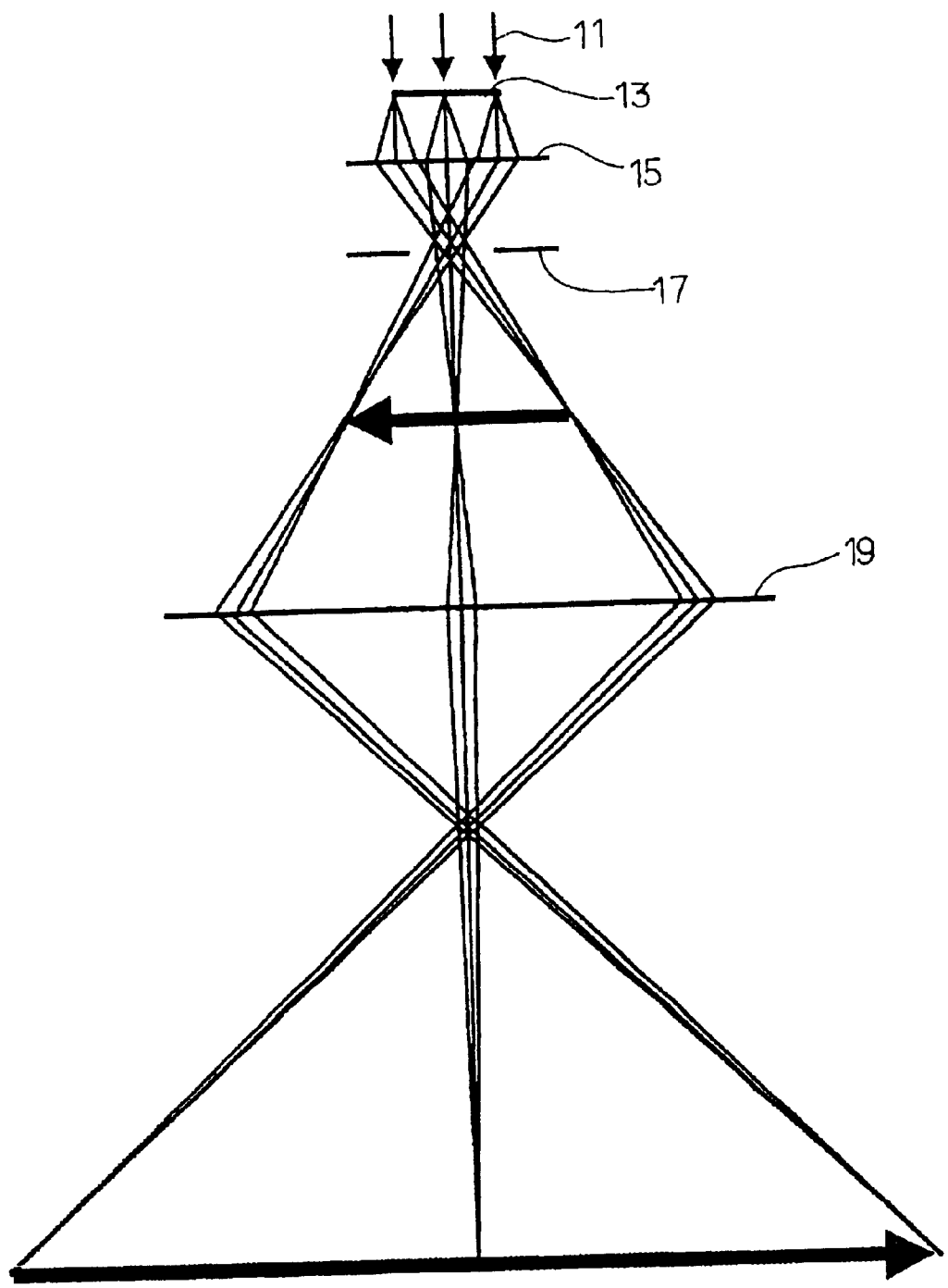
FIG. 8 is a schematic view of a second embodiment of TEM according to the present invention.

FIG. 8 shows another example of the present invention.

As shown in FIG. 8, a single or a poly crystalline material that is processed into the sample with a thickness of a few tens of nanometer (13) is placed at the center of to chamber in order to be passed through by the electron beam (11). The electron beam (11) is split into diffracted beam and transmitted beam by the interaction with the material (13) which have a crystal structure.

Transmitted beam and diffracted beam, into which the incident beam is split during the transmission through the material (13), pass an objective lens (15) and an aperture (17). As a result of the interference with these two beams, the lattice image of crystal structure is formed. In the present invention, the image plane means the plane where transmitted beam and diffracted beam make the lattice image of crystal structure by their interference during the transmission of material (13). The intermediate lens (19) magnifies the image, which is formed at the image plane.

In the present invention, spacing of the atomic plane of a material, alignment of the electron beam, the degree of vacuum in the column of the TEM, the degree of correction of a astigmatism, and the brightness of the electron gun determine the accelerating voltage. Generally, the current accelerating voltage is the range from 100 keV to 1 MeV. If the spacing of the atomic plane is about 3 angstrom, the accelerating voltage of the 100 kV is used, and if the spacing of the atomic plane is about 2 angstrom, the accelerating voltage of the 200 kV is required.

The single electron transistor device, which is fabricated by a method of the invention, has the structure that is constituted by a semiconductor substrate, a source region that is formed in the semiconductor substrate, a drain region spaced from the drain region in the semiconductor substrate, and a layer that includes quantum dots. These quantum dots are placed on the semiconductor region located between the drain region and the source region and have the same pattern with the lattice image of the material in the chamber FIG. 9 shows another example of the present invention.

Figure 9:
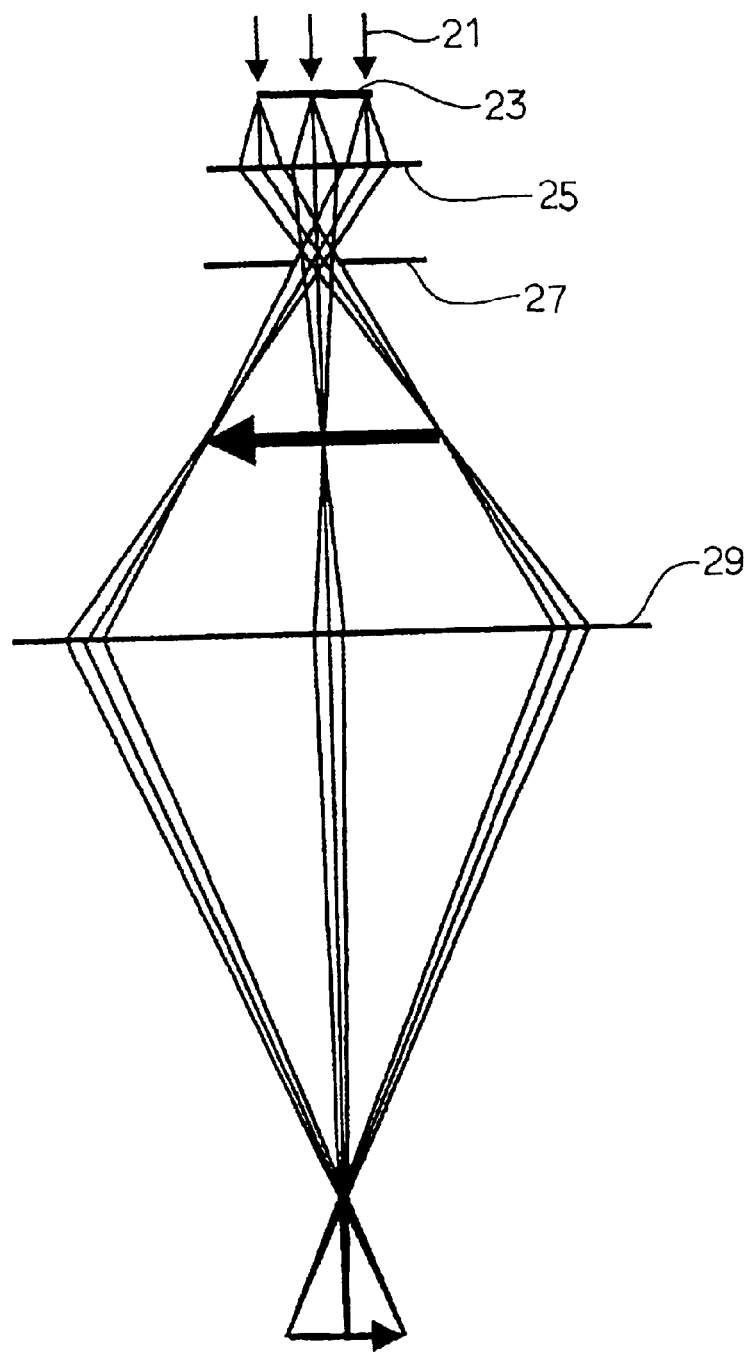
FIG. 9 is a schematic view of a third embodiment of TEM according to the present invention.

As shown in FIG. 9 a single or a poly crystalline sample material (23) of a few tens of nanometer is placed at the center of the chamber in order to be passed through by the electron beam (21). The electron beam (21) is split into diffracted beam and transmitted beam by the interaction with the material (23) which has a crystal structure.

Transmitted beam and diffracted beam, into which the incident beam is split during the transmission through the material (23), pass an objective lens (25) and an aperture (27). As a result of the interference with these two beams, the lattice image of crystal structure is formed. In the present invention, the image plane means the plane where transmitted beam and diffracted beam make the lattice image of crystal structure by their interference during the transmission of the material (23). The intermediate lens (29) can reduce the image, which is formed at the image plane.

FIGS. 10A to 10F are sectional views sequentially illustrating an embodiment of a process of fabricating a single electron transistor.

Figure 10A:
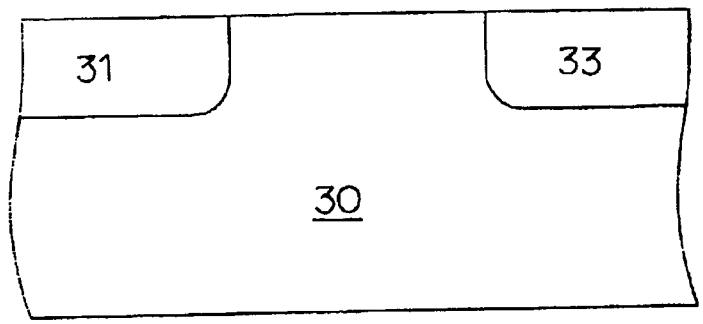
FIGS. 10A to 10F are sectional views sequentially illustrating an embodiment of a process of fabricating single electron transistor.

FIG. 10A illustrates the steps of forming a source (31) and a drain region (33) in Si wafer.

Figure 10B:
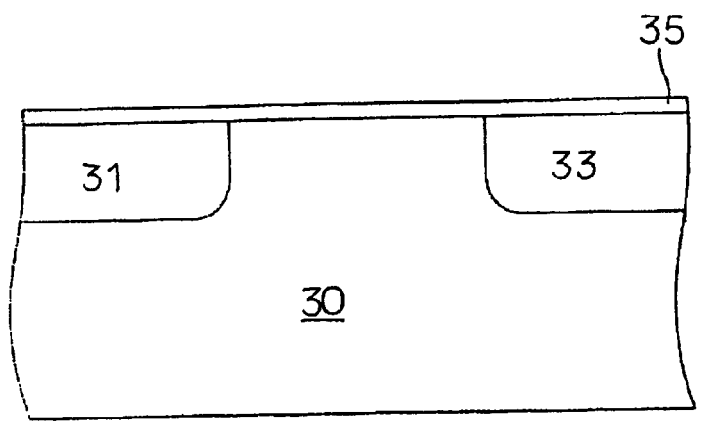

FIG. 10B illustrates the steps of growing a gate oxide film(35) of a few nm thickness on the Si wafer and depositing the amorphous Si(37) of a few nm thickness on the gate oxide(35).

Figure 10C:
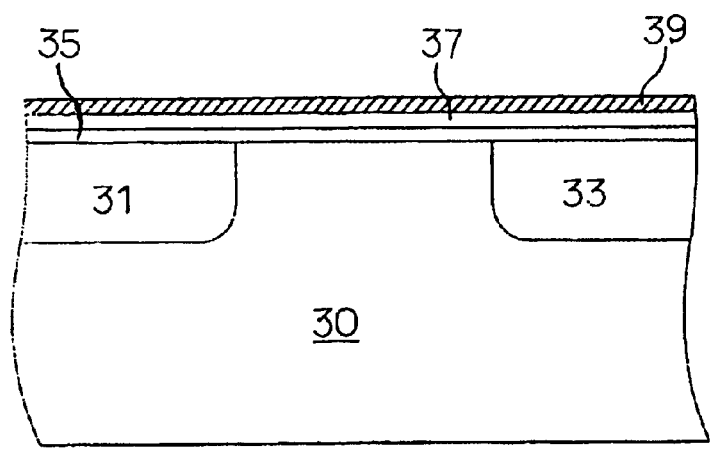

FIG. 10C illustrates the steps of coating electron beam-resist(39) on the amorphous Si(37).

Then place a silicon having [110] zone axis in the TEM chamber to form the pattern as shown in FIG. 5E.

Figure 10D:
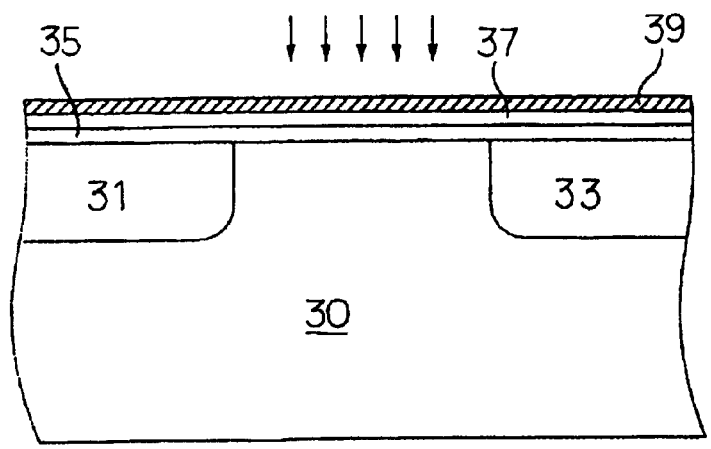

FIG. 10D illustrates the steps of radiating the electron beam to expose the electron beam-resist film(39).

Figure 10E:
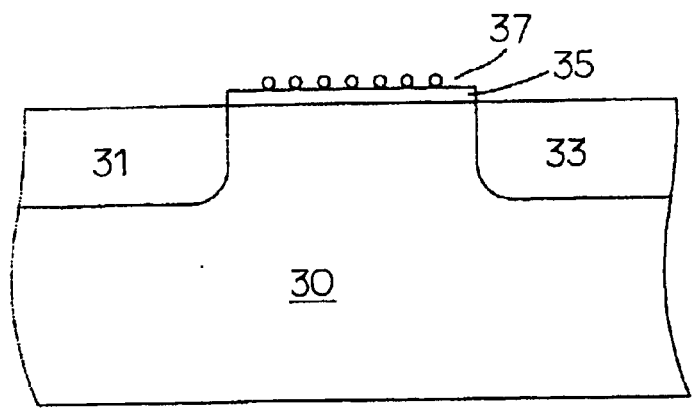

FIG. 10E illustrates the steps of removing the electron beam-resist film(39), and etching the amorphous silicon(37) using the plasma process to form quantum dots.

Figure 10F:
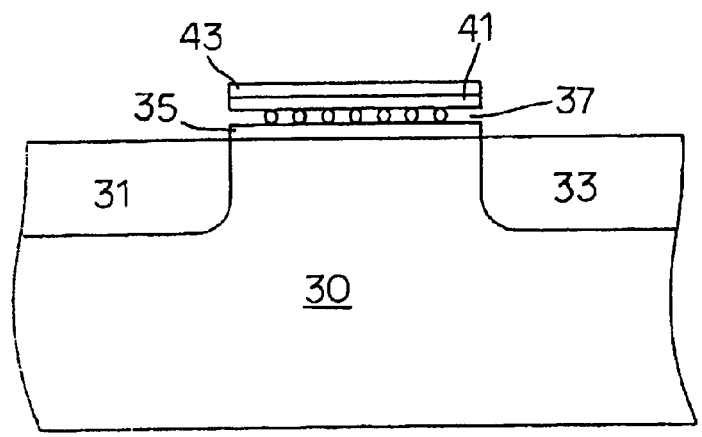

FIG. 10F illustrates the steps of depositing control oxide (41) and poly-silicon(43) on the amorphous silicon(37) on that region formed quantum dots and then patterning. As a result, the single electron transistor device is fabricated.

In the fabricated device, the pattern of quantum dot that is made on the gate oxide(35) is the same with the pattern of Si, which has [110] zone axis. The size of quantum dot is 5 nm, and the density is about 10 exp 12/cm$^2$.

In accordance with the present invention as described above, the quantum dots can be formed and controlled using the lattice image of a single or a poly crystalline crystal structure.

While the present invention has been described in detail with reference to the specific embodiments, they are mere exemplary applications. Thus, it is to be clearly understood that many variations can be made by anyone skilled in the art within the scope and spirit of the present invention.

What is claimed is:

1. A method for forming a pattern using a crystal structure of a single or a poly crystalline material, comprising the steps of:
   locating said material having a crystal structure in a chamber;
   radiating an electron beam to said material in said chamber;
   forming a pattern from a lattice image of said material formed as a result of interference between diffracted beam and transmitted beam passed through said material on the surface of an irradiated material.

2. The method of claim 1, wherein said material having a crystal structure has a thickness of a few tens of nanometer.

3. The method of claim 1, wherein said lattice image of material is formed by a method of the phase contrast imaging.

4. The method of claim 1, wherein said irradiated material is a semiconductor substrate.

5. The method of claim 1, wherein said irradiated material is an electron beam resist deposited on a substrate.

6. A method for forming a quantum dot using a crystal structure of a material as a mask, comprising the steps of:
   locating said material having a crystal structure in a chamber;
   radiating an electron beam to said material in said chamber;
   forming a pattern from a lattice image of said material formed as a result of interference between diffracted beam and transmitted beam passed through said material on the surface of an electron beam resist material on a substrate,
   patterning said electron beam resist material on said substrate.

7. The method of claim 6, wherein said lattice image of material is formed by a method of the phase contrast imaging.

8. An electron beam lithography method for forming a pattern using a crystal structure of a single or a poly crystalline material, comprising the steps of:
   providing a film of electron beam resist on a substrate;
   irradiating an electron beam to said material in a chamber;
   forming a pattern from a lattice image of said material formed as a result of interference between a diffracted beam and a transmitted beam passed through said material on said film of electron beam resist on a substrate.

9. The method of claim 8, wherein said material having a crystal structure has a thickness of a few tens of nanometer.

10. The method of claim 8, wherein said lattice image of material is formed by a method of the phase contrast imaging.

11. The method of claim 8, further comprising passing said diffracted beam and said diffracted beam through a aperture prior to said step of forming said pattern.

12. An electron beam lithography method for forming a pattern using a crystal structure of a single or a poly crystalline material, comprising the steps of:

provinding a film of electron beam resist on a substrate;

irradiating an electron beam to said material in a chamber;

forming a pattern from a lattice image of said material formed as a result of interference between a diffracted beam and a transmitted beam passed through said material on said film of electron beam resist on the substrate, patterning said film of electron beam resist on the substrate.

13. The method of claim 12, wherein said lattice image of material is formed by a method of the phase contrast imaging.

14. The method of claim 12, wherein said material having a crystal structure has a thickness of a few tens of nanometer.

15. The method of claim 12, further comprising passing said transmitted beam and said diffracted beam through an aperture prior to said step of forming said pattern.

* * * * *